(12) United States Patent
Mason et al.

(10) Patent No.: US 7,194,012 B2
(45) Date of Patent: Mar. 20, 2007

(54) LASER DRIVER CIRCUIT FOR EXTERNALLY MODULATED LASERS

(75) Inventors: T. G. Beck Mason, San Jose, CA (US); Dev E. Kumar, San Mateo, CA (US); Giorgio Giaretta, Mountain View, CA (US)

(73) Assignee: Finisar Corporation, Sunnyvale, CA (US)

(*) Notice: Subject to any disclaimer, the term of this patent is extended or adjusted under 35 U.S.C. 154(b) by 233 days.

(21) Appl. No.: 10/995,684

(22) Filed: Nov. 23, 2004

(65) Prior Publication Data

US 2005/0232319 A1 Oct. 20, 2005

Related U.S. Application Data

(60) Provisional application No. 60/560,023, filed on Apr. 5, 2004.

(51) Int. Cl.
*H01S 3/00* (2006.01)
(52) U.S. Cl. .................. 372/38.02; 372/26; 372/38.01
(58) Field of Classification Search .................. 372/26, 372/38.02, 8.01
See application file for complete search history.

(56) References Cited

U.S. PATENT DOCUMENTS

| 5,182,756 | A | * | 1/1993 | Waki et al. ............... 372/38.02 |
| 5,608,561 | A |   | 3/1997 | Marcuse et al. ............ 359/161 |
| 5,706,116 | A |   | 1/1998 | Sugata ........................ 359/180 |
| 5,883,910 | A | * | 3/1999 | Link ........................ 372/38.07 |
| 6,542,008 | B1 |  | 4/2003 | Daugherty et al. ............ 327/30 |
| 2001/0054927 | A1 | * | 12/2001 | Zhou et al. ................. 327/317 |

* cited by examiner

*Primary Examiner*—Minsun Oh Harvey
*Assistant Examiner*—Delma R. Flores-Ruiz
(74) *Attorney, Agent, or Firm*—Workman Nydegger

(57) ABSTRACT

Systems and methods for biasing an externally modulated laser. An inductorless bias T network is provided that includes a terminating resistor in series with a capacitor. The capacitor is an open circuit for a bias signal and a virtual ground for an RF signal. Thus, the RF signal is terminated by the terminating resistor without dissipating the bias signal through a ground return path of the RF signal. Using a charge pump inverter, a positive supply can be used to positively bias a laser and negatively bias the external modulator through the terminating resistor. A negative power supply is not required. A swing voltage provided by the RF signal causes the external modulator to modulate the light emitted by the laser.

24 Claims, 3 Drawing Sheets

LASER DRIVER CIRCUIT FOR EXTERNALLY MODULATED LASERS

CROSS-REFERENCE TO RELATED APPLICATIONS

This application claims the benefit of U.S. Provisional Patent Application Ser. No. 60/560,023, filed on Apr. 5, 2004, which is hereby incorporated by reference in its entirety.

BACKGROUND OF THE INVENTION

1. The Field of the Invention

The present invention relates generally to methods and circuits for transmitting information in a communications environment. More particularly, embodiments of the present invention relate to methods and circuitry for modulating optical signals in an optical communications system.

2. The Relevant Technology

Semiconductor lasers are frequently used as optical sources for transmitting information in an optical communication network. An optical network is digital, meaning that data is represented by logical 1s and 0s. In an electrical network environment, a high electrical current or voltage can represent a 1, while a low electrical current or voltage corresponds to a 0. To create these "pulses" from a constant source of electricity, a very fast electrical switching type of circuit can be used. In the optical domain, some kind of switching capability must be provided in order to alter the light signal into a stream of high and low optical power levels to represent digital information. This technique is typically referred to as "modulation," where the light signal is "modulated" in a manner so as to represent digital information.

Modulation methods for lasers generally fall into two categories: (1) direct modulation, where the bias current applied to the laser is itself modulated by an electrical data signal; or (2) indirect (external) modulation, where the bias current to the laser is held constant, and the constant light output from the laser is modulated by the electrical data signal to provide the light-wave output data signal.

Direct modulation is relatively inexpensive to implement because it requires few components. However, it is problematic in several respects. First, direct modulation techniques are susceptible to "chirp," where the exact wavelength of the light emitted varies throughout each pulse. This happens because of small changes in the laser material's refractive index due to the varying electrical current being applied to it. Chirp is indesirable because a pulse with a broad range of wavelengths is susceptible to dispersion through the transmission optical fiber.

Direct modulation also becomes problematic at bit rates above a few GHz due to the increased dispersion described above, and due to problems with the laser's so-called "relaxation oscillations." This phenomenon results from the rapid variations in light output that occur just after a laser has been switched on, and they take time to settle down. This causes difficulties at high bit-rates, thereby limiting the effective communication speeds that can be obtained when direct modulation lasers are used. Finally, direct modulation techniques can be problematic because there are implications for the reliability of lasers that are switched rapidly on and off.

In contrast, external modulation addresses some of these and other problems encountered with direct modulation. Again, when using this technique of external modulation, the electrical current applied to the laser is typically kept constant. As a result, the laser provides a constant level of output optical power. Hence, the problems with direct modulation such as excessive chirp (and therefore dispersion), relaxation oscillations, and laser reliability—all relating to turning the laser on and off—are eliminated or reduced.

In general, an external modulator is a device that is placed between the laser and the output fiber. Simply described, the external modulator is designed to let the laser's light pass when a logical 1 is desired, and to block the laser's light from passing through the external modulator when a logical 0 is desired. Generally, signals from externally modulated lasers can travel much farther (in terms of their dispersion performance), and at higher data rates, than their directly modulated counterparts. Thus, this approach is generally a preferred alternative for multi-gigabit applications.

However, the extra performance provided by external modulation does result in some drawbacks. In particular, external modulation generally requires additional technology in the form of additional electronic components, and dictates the use of additional and alternative power requirements. This in turn gives rise to a number of problems, including additional power dispersion, increased cooling requirements, and increased physical space requirements. Such considerations are especially problematic in those environments where physical space is at a premium, such as in electro-optical transceiver modules conforming with standards such as the Small Form-Factor Module Multi-Source Agreement (SFF MSA), the Small Form-Factor Pluggable Module Multi-Source Agreement (SFP MSA) and the 10 Gigabit Small Form Factor Pluggable Module Multi-Source Agreement (XFP MSA) Revision 4.0, which are incorporated herein by reference.

Physical space problems have been at least partially addressed by utilizing so-called integrated electro-absorption types of optical modulators (sometimes referred to as EA modulators). Electro-absorption modulators are made of similar materials to semiconductor lasers, thereby allowing them to be integrated with the lasers they are to be used with. Thus, the modulator and the laser are fabricated as an integrated device on a common chip substrate. In this environment, light is generated in the laser by applying an electric current to pass through a semiconductor material. Thus, the semiconductor laser must be "forward biased" with an appropriate current. The electro-absorption modulator is similar to the laser, but to prevent light passing through it (to give a 0) it needs a "reverse bias" voltage to give it the requisite light-absorbing properties. To represent a 1, no reverse bias voltage is applied to the electro-absorption modulator, which causes the modulator to behave transparently to the laser light.

Thus, in a typical environment having an electro-absorption modulated laser arrangement, there must be a suitable laser driver configuration. For example, in a typical arrangement, a current source is provided to supply a sufficient forward bias current to the semiconductor laser—typically via a sufficient supply voltage (for example, a 5 volt supply). Here, there must be a sufficient voltage "headroom" to provide a sufficient current to drive the laser. In a typical arrangement, this headroom must be at least approximately 3.3 volts. In contrast, the electro-absorption (EA) modulator requires a voltage that can be reverse biased, below ground, to sufficiently gate the optical signal from the laser. To accomplish this, typical prior art solutions provide a driver having a differential output pair stage that operates between ground and a negative power supply. This allows the EA modulator to be driven with a sufficient negative voltage range (reverse bias) so that it can absorb the light emitted by the laser diode.

This need to provide a sufficient forward bias to supply current to the laser, and a sufficient reverse bias voltage to the EA modulator gives rise to a problem. In particular, this arrangement typically requires an overall higher voltage headroom for driving the diode pair of the externally modulated laser ("EML") by accommodating both the current requirements of the laser and the reverse bias requirements of the EA modulator. For example, a headroom of 7 volts differential or more may be needed. Thus, if an EML environment is desired, a typical transceiver module might need to provide +3.3, +1.8 and +5 volt supply lines, plus an additional −5.2 volt supply so as to achieve the headroom needed.

FIG. 1, for example, illustrates a DC coupled driver bias network that requires a negative power supply. The RF signal applied to the external modulator 104 is an electrical signal that alters the bias applied to the external modulator 104. Thus, the external modulator 104 either blocks or passes the laser light based on the RF signal.

In FIG. 1, the laser 106 is biased to emit light at a constant optical output. The external modulator 104 is DC coupled to both the RF and bias 110. The bias is −5.2 volts, in this example, and is needed to insure that the modulation (RF signal) can cause the external modulator 104 to either block or pass the light emitted by the laser 106. As previously described, the laser light is modulated as the external modulator blocks or passes the laser light.

In the example of FIG. 1, power dissipation is a problem for various reasons. The bias is DC coupled to the external modulator 104 and therefore dissipates power through the resistor 102, which is needed for proper termination of the RF signal. The dissipation of the negative bias, in addition to the dissipation required for the laser 106, requires additional cooling capability. In turn, the additional cooling capability, often provided by inefficient thermoelectric cooler (TEC), requires additional power. This increases the power requirements of the EML and makes it difficult to comply, for example, with the power requirements specified by the SFF, SFP, and XFP standards.

FIG. 2 illustrates similar problems in a conventional bias T network 200. In FIG. 2, the RF 210 is capacitively coupled to the network 200, but the bias 212 of the external modulator 204 still dissipates power through the resistor 202. The inductor 214 is low impedance to a DC source, but is high impedance to the RF signal. Thus, the resistor 202 provides the proper termination for the RF 210. In addition, the inductor 214 can occupy substantial space and is therefore unsuitable for use in transceivers that conform with the SFP or XFP standards, for example. Further, the network 200 still requires a negative power supply for the bias 212 in order to appropriately bias the external modulator 204.

In general, these arrangements are problematic in that extra power requirements give rise to a number of undesirable factors, including cost (for extra power supply devices), added design complexity, increased power dissipation levels, which in age turn requires additional cooling components (and thus additional electrical power). Consequently, the solution is typically unsuitable, especially given the ongoing objective to physically reduce the size of transceiver modules and keep power requirements within certain bounds.

Thus, it would be an advancement in the art to provide an EML that can be adequately biased without requiring the presence of an extra negative voltage, such as a negative 5.2 volt supply, to the transceiver. At the same time, the approach should provide a sufficient voltage headroom to allow for proper operation of the EML diodes.

SUMMARY OF AN EXAMPLE EMBODIMENT OF THE INVENTION

Embodiments of the invention disclosed herein extend to laser drivers for use with externally modulated lasers used in transmitter optical sub-assemblies. The laser drivers operate without requiring a negative voltage supply, such as a −5.2 volt supply. Thus, optical transceiver modules in which the laser drivers are used can operate using only positive voltage supplies, which are more readily compatible with existing transceiver module standards, such as the SFP MSA and XFP MSA specifications. In addition, the power requirements for the modulator bias and the corresponding power dissipation in the termination resistor are reduced. This reduces the heat dissipation requirements of the thermoelectric cooler, which can result in substantially lower power requirements for the overall transceiver module.

According to one implementation, the laser drivers use an inductorless bias T network. The bias T network includes a capacitor placed in series with a termination resistor. Because the capacitor opens the circuit with respect to direct current, no direct current is driven through the termination resistor, thereby substantially eliminating, or reducing power dissipation through the termination resistor. In addition, the laser driver is AC coupled to the EA modulator, such that there is no need to swing from −1 to −3 volts. Instead, the EA modulator merely requires any volt swing, which can be accomplished using a positive power supply. In particular, a negative bias voltage is applied at the bias input. However, because this voltage source merely needs to be capable of sinking enough current to absorb the photocurrent from the modulator, the voltage can be generated using a charge pump converter.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF AN EXAMPLE EMBODIMENT

Embodiments of the invention relate to systems and methods for biasing an externally modulated laser and more particularly for appropriately biasing both the laser and the external modulator in an externally modulated laser (EML). In one example implementation, a laser driver circuit for biasing an EML and a method for biasing an EML is provided. The driver circuit is implemented in a manner that permits use of an EML in a transceiver, and yet does so in a manner such that the need for a negative voltage supply is eliminated.

Said differently, in an example embodiment, the driver circuit utilizes a biasing scheme that allows the EA modulator portion of an EML to be sufficiently reverse biased without requiring the connection, for example, of a negative 5.2 voltage supply to the transceiver module. This reduces the overall physical size needed to implement the transceiver module, and also reduces the overall power requirements of the module. This reduction in power reduces the amount of power/heat that is dissipated by the EML, and also reduces the power needed for thermal control elements. This facilitates the use of an EML in, by way of example, SFP and XFP transceivers.

Embodiments of the invention can be implemented in a transceiver as well as in a Transceiver Optical Sub Assembly (TOSA), which may be part of a transceiver. Thus, a TOSA may include a laser and an electro-absorption modulator. A modulator driver, which is separate in some embodiments, biases the electro-absorption (EA) modulator. The intensity of the light generated by the laser is externally modulated using the EA modulator to encode data onto the optical signal emitted by the laser. The EML is generally formed from a single piece of semiconductive material, which means that there is a common cathode for the laser and the associated EA modulator. As described above, the laser needs a current to generate light, while the EA modulator needs a voltage bias that is negative with respect to the common cathode.

As previously stated, it is undesirable to include a negative voltage supply within the TOSA or other components of the optical transceiver module. The techniques disclosed herein enable a sufficient bias to be obtained without the need for a negative voltage supply to the module. Thus, optical transceiver modules, transceivers or TOSAs that use the laser drivers disclosed herein can use the standard voltages defined by the SFP specification, XFP specification, or other standards.

The need for a negative voltage supply is eliminated by AC coupling the modulating signal to the EML, while bringing the bias through the ground return path of the RF. The laser or modulator drivers described herein use a bias T network in one example. A conventional bias T network uses relatively large inductors that are generally not suitable for use in an optical transceiver module.

Figure 3:
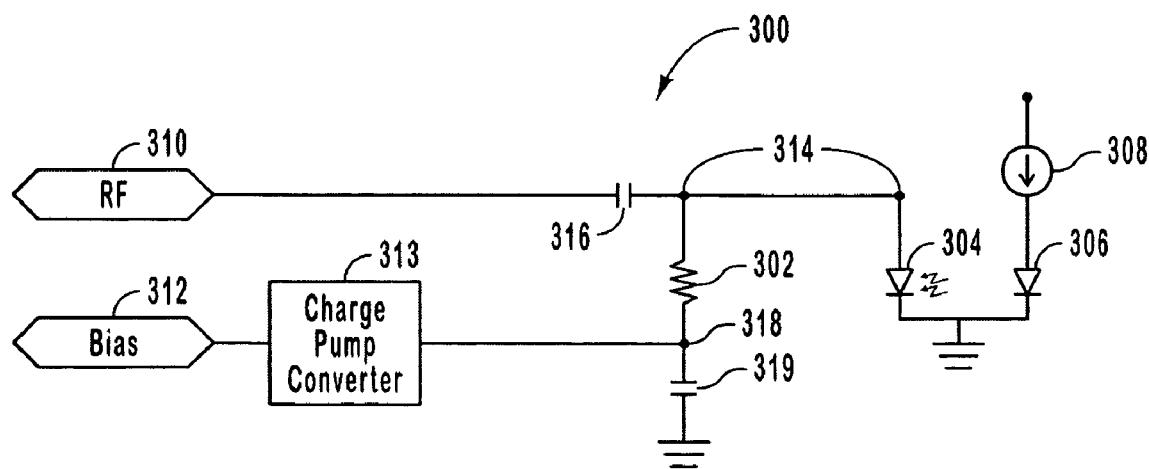
FIG. 3 illustrates an inductorless driver bias network for use with an externally modulated laser.

According to embodiments disclosed herein, the laser drivers use an inductorless bias T network having a virtual ground point with a capacitor as illustrated in FIG. 3. This approach has at least two advantages. First, it eliminates the need to provide a negative voltage supply, such as a −5.2 volt supply. Second, it greatly reduces the active power dissipation that must be performed by the TEC as described in more detail below.

FIG. 3 illustrates an example of an inductorless bias network. The network 300 can be used to bias the EA modulator 304 used in an EML laser. The RF 310 is capacitively coupled to the network 300 by the capacitor 316. The resistor 302 terminates the RF 310 appropriately because the capacitor 319 is effectively a short with respect to the RF 310. In other words, the node 318 is a virtual ground for the RF 310.

At the same time, the capacitor 319 is an open circuit to any DC bias. The bias 312 can then be applied to the network 313 to provide the necessary negative bias to the EA modulator 304. Thus, the bias 312 is provided to the network 300 through the ground return path of the RF 310. In this example, a DC to DC charge pump converter 313 generate a negative voltage from a positive bias 312. This eliminates the need to have a negative power supply to the network 300.

The bias 312 can therefore provide the negative voltage required at the node 314 to provide the negative bias needed by the EA modulator 304. The RF 310 can a modulate or change the voltage at the node 314 such that the EA modulator 304 effectively modulates light emitted by the laser 306. In this example, the laser 306 is biased with a current source 308 or has a positive bias.

Figure 1:
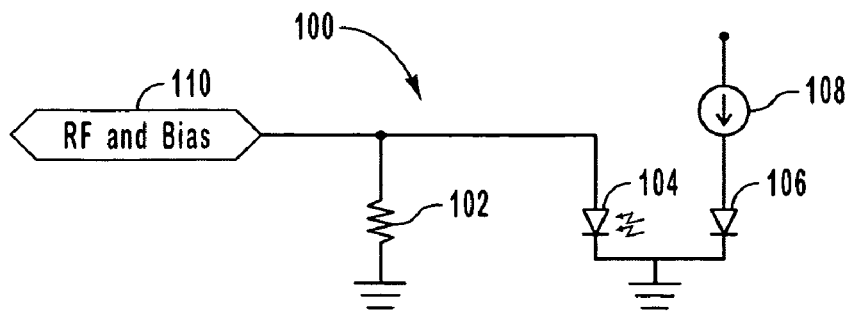
FIG. 1 illustrates a DC coupled driver bias network that requires a negative power supply for the EA driver.
Figure 2:
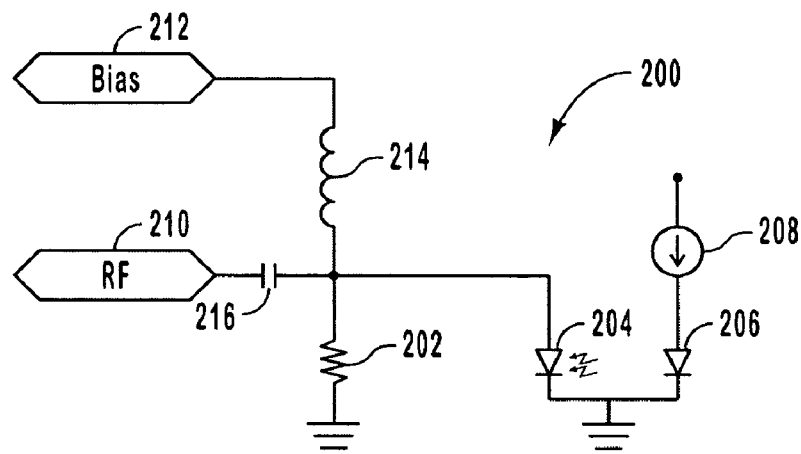
FIG. 2 illustrates a conventional bias T driver network.

The capacitor 319 provides the additional advantage of preventing the bias 312 from dissipating power to ground. FIG. 1, for example, illustrates that the bias 110 dissipates power through the resistor 102. Likewise, FIG. 2 shows that the bias 212 dissipates power unnecessarily through the resistor 202. The bias 312 in the network is configured such that the resistor 302 terminates the RF 310 without requiring the bias 312 to dissipate power unnecessarily through the resistor 302. As a result, the power requirements of the network 300 are less than the power requirements of the networks illustrated in FIGS. 1 and 2. Further, the reduced power has an advantageous impact on cooling requirements.

In a TOSA (such as the TOSA illustrated in FIGS. 4A and 4B described below) the externally modulated laser is positioned on the TEC. To obtain acceptable optical performance of the laser, the TEC maintains the operating temperature of the laser within a specified range. As more heat is to be pumped away from the laser by the TEC, the power requirements of the TEC increase. In addition, operating a TEC in a cooling mode is relatively inefficient. For example, to dissipate 100 mW of heat from the EML using a typical TEC, approximately 300 mW of power must be supplied to the TEC. Thus, a small amount of additional heat generated by the EML results in the need to supply a disproportionate amount of power to the TEC to obtain the necessary cooling.

In general, anything that can be done to reduce the amount of heat generated by the EML and its driver circuit greatly reduces (by a factor of 3 or 4 in one example) the amount of power that must supplied to the TEC. This is exacerbated by the fact that the driver for the TEC is typically only 60 to 70% efficient. Thus, a small amount of power saved in the EML and its active circuit will reduce the overall amount of power required for the entire module assembly (e.g., the EML, TEC, TEC driver), by a disproportionate amount. For example, a reduction in the power consumption of the EML active circuitry by about 100 mW can reduce the power requirements of the overall optical transceiver module by as much as 500 mW or more.

The EA modulator is driven by an RF signal. The RF signal is terminated with a termination resistor, which is typically about 50 ohms. This termination resistor has a bias voltage across it, nominally about −2 volts (assuming the bias swing is approximately −1 to −3 volts). Thus, the network 300 eliminates the power dissipated through the resistors 102 and 202, for example. As a result, the network 300 reduces the power requirements of the TEC. In one embodiment, the DC bias does not dissipate across the terminating resistor.

According to embodiments disclosed herein, the amount of power dissipated by the laser driver is reduced and the need for the negative voltage supply, such as a −5.2 volt supply, is eliminated. This is done in one embodiment by placing a capacitor in series with the termination resistor as illustrated in FIG. 3. No direct current is driven through the termination resistor since the capacitor is an open circuit to direct current. This removes that aspect of the power dissipation through the termination resistor. As shown in FIG. 3, a capacitor is also placed in series with the rest of the driver circuit. Because the driver is AC coupled to the EA modulator, there is no need to swing from −1 to −3 volts. Instead, the EA modulator merely requires any 2 volt swing. Thus, the TOSA and the optical transceiver module can use a 2 volt peak to peak positive power supply with the laser modulator driver.

This approach eliminates the need to provide a bias T network with an inductor, which is expensive and physically very large. Moreover, as noted above, the elimination of the inductor is compatible with the elimination of the DC power across the termination resistor, which reduces power dissipation and the overall power requirements for the optical transceiver module.

In contrast to the difficulties associated with large inductors, it is relatively easy and space efficient to use a capacitor. Moreover, use of the capacitor eliminates the problems that would otherwise be associated with DC passing through the termination resistor, and thus the power dissipation. As noted previously, the capacitor appears as a short to the RF, but is an open circuit to the DC bias, thus preventing DC from flowing through the termination resistor. The need for the −5.2 volt bias voltage supply is also eliminated.

The laser drivers disclosed herein can be used in any of a variety of optical transceiver modules. They are well-suited for use with transceivers in which power dissipation is important, and those in which power and space are limited. These laser drivers can be particularly advantageous when used in optical transceiver modules that comply with the XFP standard.

The laser biasing methods and systems disclosed herein can be used with a variety of optical sub-assemblies. An example of a transmitter optical sub-assembly (TOSA) having a header assembly with a ceramic feed through that can be used in connection with embodiments of the invention is disclosed in U.S. patent application Ser. No. 10/629,724, filed Jul. 28, 2003, which is incorporated herein by reference. The foregoing patent application describes a TOSA that includes a EML that can be adapted for use with the laser drivers disclosed herein. This ceramic feed through environment improves RF response as well as increasing thermal performance using a thermoelectric cooler that conducts heat away from the laser.

Figure 4A:
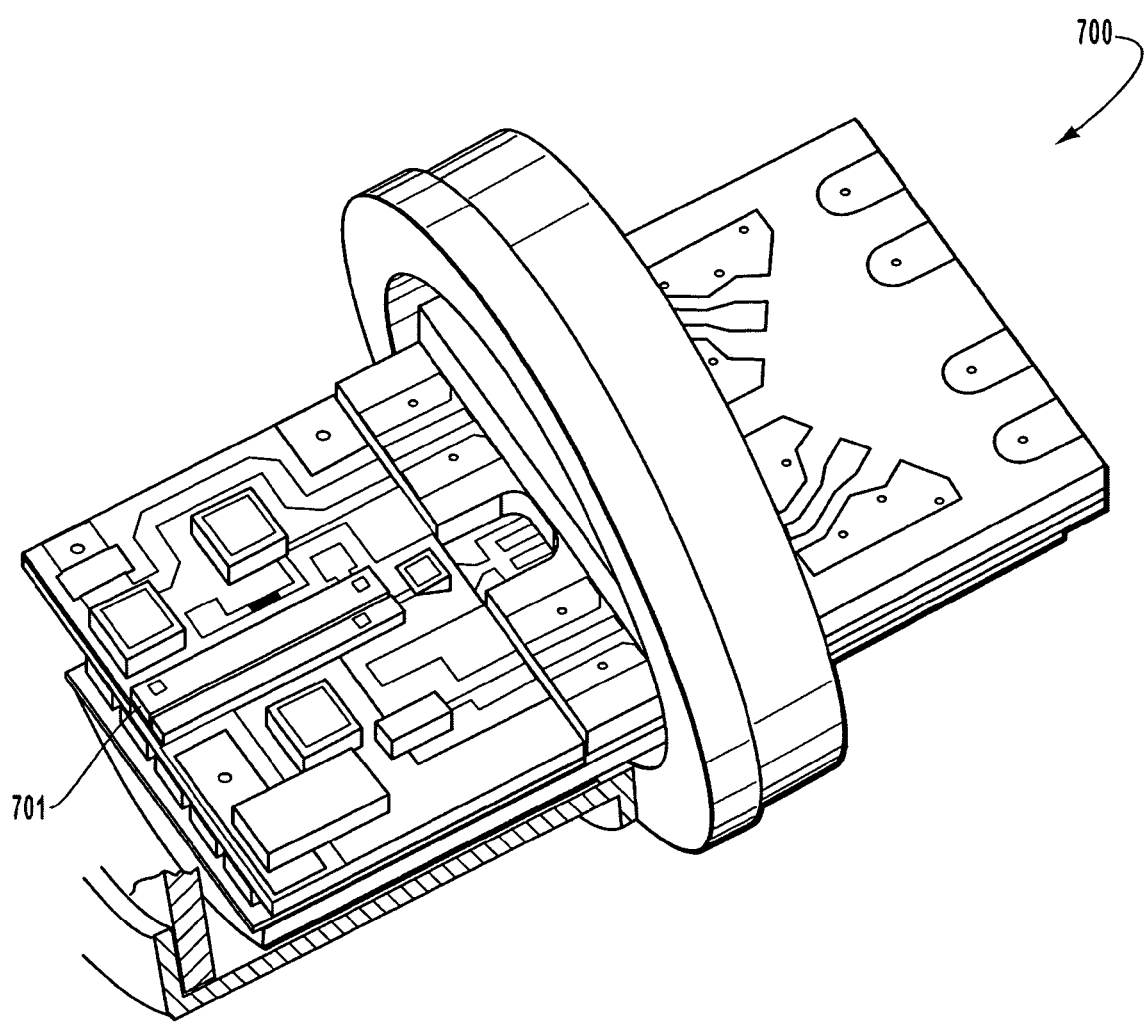
FIG. 4A illustrates one embodiment of a transmitter optical sub-assembly (TOSA) having a header assembly with a ceramic feedthrough.
Figure 4B:
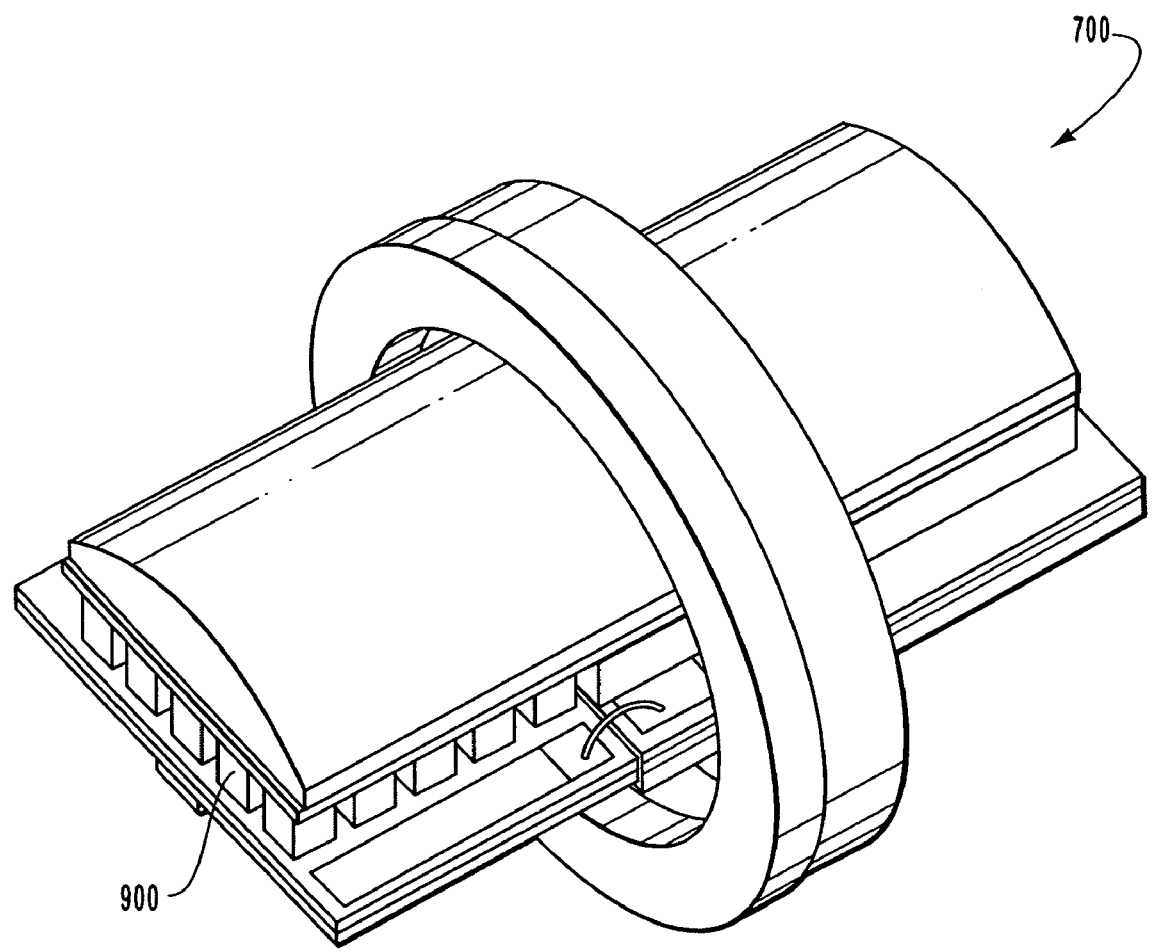
FIG. 4B illustrates another view of the TOSA of FIG. 4A and illustrates a thermoelectric cooler (TEC).

FIGS. 4A and 4B illustrate one embodiment of a TOSA that may include an externally modulated laser and are more fully described in U.S. patent application Ser. No. 10,629,724. Generally, FIG. 4A illustrates a perspective view of a TOSA 700. The laser 701 is an EML and includes an external modulator that includes a common cathode with a laser. A power supply is provided thorough the contacts 810.

The TOSA 700 includes a TEC 900 that operates to cool the TOSA 700 or the EML laser 701. By implementing the network 300 described in FIG. 3, the TOSA 700 only requires a positive power supply to positively bias the laser portion of the EML and to negatively bias the EA portion of the EML. Further, the DC bias dissipated thorough termination resistor of the RF signal is reduced or eliminated as described previously.

The present invention may be embodied in other specific forms without departing from its spirit or essential characteristics. The described embodiments are to be considered in all respects only as illustrative and not restrictive.

We claim:

1. A laser driver circuit for controlling operation of an externally modulated laser, comprising:
   a current source for biasing the externally modulated laser; and
   a voltage source for reverse biasing an external modulator that shares a common cathode with the externally modulated laser, wherein the current source and the voltage source are connected to the externally modulated laser and the external modulator using an inductorless bias T network, wherein the bias T network:
   includes a capacitor positioned in series with a termination resistor of the bias T network; and
   is AC coupled to the external modulator.

2. The laser driver circuit of claim 1, wherein the inductorless bias T network permits the external modulator to be reverse biased with only a positive voltage supply being provided for the laser driver circuit.

3. The laser driver circuit of claim 1, wherein the capacitor reduces power dissipation across the termination resistor compared to the power dissipation that would exist in the absence of said capacitor.

4. The laser driver circuit of claim 1, further comprising a charge pump converter to generate a negative voltage from the voltage source.

5. The laser driver circuit of claim 1, further comprising an RF signal to modulate a bias voltage across the external modulator.

6. The laser deriver circuit of claim 5, wherein the RF signal is AC coupled to the external modulator.

7. A laser driver circuit of an externally modulated laser, the laser driver circuit comprising:
   an external modulator that is used to modulate light emitted by a laser;
   a voltage source connected to a terminating resistor in series with a first capacitor, wherein the voltage source provides a negative bias to the external modulator; and
   an RF signal coupled with the terminating resistor such that the RF signal provides a swing voltage to control the negative bias such that the light emitted by the laser is modulated by the RF signal, wherein the first capacitor is a virtual ground to the RF signal and an open circuit to the voltage source such that the voltage source does not dissipate power through a ground return path of the RF signal.

8. A laser driver circuit as defined in claim 7, further comprising a second capacitor that capacitively couples the RF signal with the terminating resistor.

9. A laser driver circuit as defined in claim 7, further comprising a charge pump converter that converts the voltage source to a negative voltage.

10. A laser driver circuit as defined in claim 7, further comprising a current source to positively bias the laser.

11. A laser driver circuit as defined in claim 7, wherein the terminating resistor is terminates the RF signal.

12. A laser driver circuit as defined in claim 7, wherein the external modulator and the laser share a common cathode on a substrate.

13. A laser driver circuit as defined in claim 7, wherein the external modulator and the laser are mounted in a TOSA.

14. A laser driver circuit as defined in claim 7, further comprising a thermo-electric cooler to remove heat from at the laser driver circuit.

15. An externally modulated laser for use in a transceiver, the externally modulated laser comprising:
- a laser having a positive bias; and
- an external modulator driven by a laser driver circuit that provides a negative bias used to modulate light emitted by the laser, the laser driver circuit comprising:
  - an RF signal input capacitively coupled to the external modulator;
  - a bias signal; and
  - a terminating resistor connected in series with a first capacitor, wherein the first capacitor provides a virtual ground to the RF signal such that the terminating resistor terminates the RF signal and wherein the first capacitor provides an open circuit to the bias signal such that the bias signal does not dissipate power through a ground return path of the RF signal.

16. An externally modulated laser as defined in claim 1, wherein the bias signal connects to a node between the terminating resistor and the first capacitor.

17. An externally modulated laser as defined in claim 16, wherein the virtual node occurs at the node.

18. An externally modulated laser as defined in claim 1, wherein the terminating resistor connects with an anode of the external modulator at a second node.

19. An externally modulated laser as defined in claim 18, further comprising a charge pump converter that generates a negative voltage from the bias signal such that the negative bias occurs at the second node.

20. An externally modulated laser as defined in claim 19, wherein the bias signal is a positive voltage supply.

21. An externally modulated laser as defined in claim 1, wherein the RF signal provides a swing voltage at the second node causing the external modulator to either block or pass light emitted by the laser.

22. An externally modulated laser as defined in claim 1, further comprising a thermo electric cooler connected with the laser driver circuit.

23. An externally modulated laser as defined in claim 22, wherein the externally modulated laser is encapsulated within a transceiver optical sub assembly.

24. An externally modulated laser as defined in claim 23, wherein the laser driver circuit and the thermoelectric cooler are contained within the transceiver optical sub assembly.

* * * * *